(12) United States Patent
Su et al.

(10) Patent No.: US 9,118,033 B2
(45) Date of Patent: Aug. 25, 2015

(54) ORGANIC LIGHT-EMITTING DIODE AND DISPLAY DEVICE EMPLOYING THE SAME

(71) Applicant: InnoLux Corporation, Miao-Li County (TW)

(72) Inventors: Hsin-Yuan Su, Miao-Li County (TW); Chun-kai Li, Miao-Li County (TW); Chien-Hsun Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 13/799,375

(22) Filed: Mar. 13, 2013

(65) Prior Publication Data

US 2013/0285022 A1   Oct. 31, 2013

(30) Foreign Application Priority Data

Apr. 25, 2012   (TW) .............................. 101114643 A

(51) Int. Cl.
*H01L 51/50* (2006.01)
*H01L 51/00* (2006.01)
*H01L 27/32* (2006.01)

(52) U.S. Cl.
CPC ......... *H01L 51/5092* (2013.01); *H01L 27/3248* (2013.01); *H01L 51/0081* (2013.01); *H01L 51/5076* (2013.01); *H01L 2251/308* (2013.01); *H01L 2251/5353* (2013.01)

(58) Field of Classification Search
CPC ............ H01L 51/5068; H01L 51/5092; H01L 51/5221
USPC ........................................................... 257/40
See application file for complete search history.

(56) References Cited

U.S. PATENT DOCUMENTS

| | | | |
|---|---|---|---|
| 7,889,160 | B2 | 2/2011 | Yoo |
| 2004/0263056 | A1* | 12/2004 | Seo et al. ....................... 313/500 |
| 2006/0082289 | A1* | 4/2006 | Yeh et al. ....................... 313/504 |
| 2007/0040161 | A1* | 2/2007 | Kumaki et al. ................. 257/13 |
| 2007/0222370 | A1 | 9/2007 | Zhu et al. |
| 2010/0133523 | A1* | 6/2010 | Nowatari et al. ............... 257/40 |
| 2012/0256197 | A1 | 10/2012 | Matsuhisa et al. |

FOREIGN PATENT DOCUMENTS

| | | |
|---|---|---|
| CN | 1525801 | 9/2004 |
| CN | 1895003 | 1/2007 |
| CN | 101097680 | 1/2008 |

(Continued)

OTHER PUBLICATIONS

Taiwanese language office action dated Sep. 9, 2014.
English language translation of abstract of TW I261483 (published Sep. 1, 2006).

(Continued)

*Primary Examiner* — Thomas L Dickey
(74) *Attorney, Agent, or Firm* — McClure, Qualey & Rodack, LLP

(57) ABSTRACT

An organic light-emitting diode and a display device employing the same are provided. The organic light-emitting diode includes a substrate; a cathode disposed on the substrate; an electron injection layer disposed on the cathode, wherein the electron injection layer includes a low work function metal layer and a metal complex layer having carrier injection capability; a light-emitting layer disposed on the electron injection layer; and an anode disposed on the light-emitting layer.

15 Claims, 6 Drawing Sheets

(56) References Cited

FOREIGN PATENT DOCUMENTS

| | | |
|---|---|---|
| CN | 102097601 | 6/2011 |
| TW | I261483 | 9/2006 |
| TW | 201133977 | 10/2011 |

OTHER PUBLICATIONS

English language translation of abstract of TW 201133977 (published Oct. 1, 2011).

Chinese language office action dated Apr. 28, 2015, issued in CN application No. 201210123897.8.

* cited by examiner

ORGANIC LIGHT-EMITTING DIODE AND DISPLAY DEVICE EMPLOYING THE SAME

CROSS REFERENCE TO RELATED APPLICATIONS

This application is based upon and claims the benefit of priority from the prior Taiwan Patent Application No. 101114643, filed on Apr. 25, 2012, the entire contents of which are incorporated herein by reference.

BACKGROUND

1. Technical Field

The present disclosure relates to a display device, and in particular to a display device having an organic light-emitting diode.

2. Description of the Related Art

Recently, with the development and wide application of electronic products, such as mobile phones, and notebook computers, there has been increasing demand for flat display elements which consume less power and occupy less space. Organic light-emitting diodes (OLEDs) are popular for use in flat-panel displays as they are self-emitting and highly luminous, provide wide viewing angles, have a fast response speed, and enjoy a simple fabrication process.

An organic light-emitting diode is an LED that uses an organic layer as the active layer. In recent years, organic light-emitting diodes have been gradually employed in flat-panel displays. One trend in organic light-emitting diode technology is for achieving higher luminescent efficiency and a longer life span.

Generally, an organic light-emitting diode is composed of a light-emitting layer sandwiched between a pair of electrodes. When an electric field is applied to the electrodes, the cathode injects electrons into the light-emitting layer and the anode injects holes into the light-emitting layer. When the electrons recombine with the holes in the light-emitting layer, excitons are formed. Recombination of the electron and hole results in light emission.

In accordance with driving methods, an organic light-emitting diode device is a passive matrix type or an active matrix type. The active matrix organic light-emitting diode (AM-OLED) device is driven by electric currents, in which each of the matrix-array pixel areas has at least one thin film transistor (TFT), to control the brightness and gray level of the pixel areas. The thin film transistors can be a p-type transistor or an n-type transistor. The active matrix organic light-emitting diode device has a panel luminescence with thin and light-weight characteristics, and a spontaneous luminescence with high luminance efficiency and low driving voltage.

When a standard organic light-emitting diode (the term "standard organic light-emitting diode" means that an organic light-emitting diode includes an anode, a hole injection layer, hole transport layer, light-emitting layer, electron transport layer, electron injection layer, and a cathode sequentially formed on a substrate) is coupled to an n-type transistor to form an organic light-emitting diode device, the standard organic light-emitting diode has to electrically connect to a source electrode of the n-type transistor. Hence, an image sticking phenomenon is apt to be observed occur during operation of the aforementioned organic light-emitting diode device.

To solve above-mentioned problems, an organic light-emitting diode device including an inverted organic light-emitting diode (the term "inverted organic light-emitting diode" means that an organic light-emitting diode includes a cathode, an electron injection layer, an electron transport layer, a light-emitting layer, a hole transport layer, a hole injection layer, and an anode sequentially formed on a substrate) coupled to a drain electrode of an n-type transistor. The inverted organic light-emitting diode, however, exhibits lower luminous efficiency and higher driving voltage in comparison with standard organic light-emitting diodes with the same layers due to the inferior electron injection characteristic.

Therefore, an organic light-emitting diode device capable of increasing luminous efficiency and reducing driving voltage is desirable.

SUMMARY

An exemplary embodiment of the disclosure provides an organic light-emitting diode including: a substrate; a cathode disposed on the substrate; an electron injection layer disposed on the cathode, wherein the electron injection layer includes a low work function metal layer and a metal complex layer having carrier injection capability; a light-emitting layer disposed on the electron injection layer; and an anode disposed on the light-emitting layer.

Another exemplary embodiment of the disclosure provides a display device including a plurality of pixels. Particularly, each pixel includes: the aforementioned organic light-emitting diode, and a transistor coupled to the organic light-emitting diode.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The disclosure provides an organic light-emitting diode and a display device employing the same. Particularly, the organic light-emitting diode includes a composite electron injection layer, thereby improving the electron injection characteristic, reducing the driving voltage, increasing the luminous efficiency and lifetime of the organic light-emitting diode. Further, the organic light-emitting diode is suitable for serving as an inverted organic light-emitting diode.

The following description is of the best-contemplated mode of carrying out the invention. This description is made for the purpose of illustrating the general principles of the disclosure and should not be taken in a limiting sense. The scope of the disclosure is best determined by reference to the appended claims.

Figure 1:
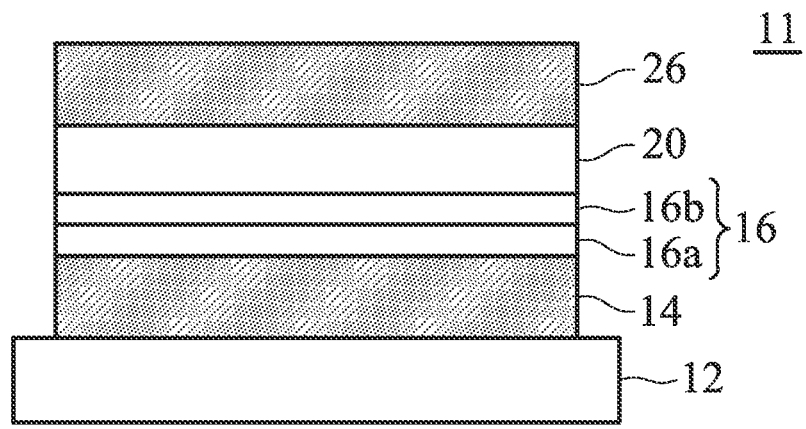
FIG. 1 is a cross-section of an organic light-emitting diode according to an embodiment of the invention.

As shown in FIG. 1, an organic light-emitting diode 11 according to an embodiment of the disclosure is provided. The organic light-emitting diode 11 includes a substrate 12, wherein the substrate 12 can be a quartz substrate, a glass substrate, a ceramic substrate, or a plastic substrate. Further, the substrate 12 can be a substrate including a required element (such as a thin film transistor). The accompanying drawings illustrate the substrate 12 as a plain rectangle in order to simplify the illustration.

Still referring to FIG. 1, a cathode 14, an electron injection layer 16, and a light-emitting layer 20 are formed sequentially on the substrate. Finally, an anode 26 is formed on the light-emitting layer 20. The organic light-emitting diode 11 can be a bottom-emission organic light-emitting diode, or a top-emission organic light-emitting diode. If the organic light-emitting diode 11 is a bottom-emission organic light-emitting diode, the cathode can be a transparent electrode or semi-transparent electrode. For example, materials of the transparent electrode can be indium tin oxide (ITO), indium zinc oxide (IZO), aluminum zinc oxide (AZO), or zinc oxide (ZnO). The semi-transparent electrode can have a transparency of more than 50% and be a semi-transparent metal layer electrode (such as Al, Cu, Mo, Ti, Pt, Ir, Ni, Cr, Ag, Au, W, or alloys thereof) or a composite electrode including metal and transparent conductive material (such as indium tin oxide (ITO), indium zinc oxide (IZO), aluminum zinc oxide (AZO), or zinc oxide (ZnO). Further, if the organic light-emitting diode 11 is a top-emission organic light-emitting diode, the cathode can be an opaque electrode. The opaque electrode can be a metal electrode with relatively high thickness (such as Al, Cu, Mo, Ti, Pt, Ir, Ni, Cr, Ag, Au, W, or alloys thereof), or a transparent electrode (such as indium tin oxide (ITO), indium zinc oxide (IZO), aluminum zinc oxide (AZO), or zinc oxide (ZnO)) having a reflective layer thereon.

The electron injection layer 16 can comprise a low work function metal layer 16a, and a metal composite layer 16b having carrier injection characteristics, resulting in an increase in the electron injection characteristic of the organic light-emitting diode 11. Therefore, the organic light-emitting diode 11 exhibits lower driving voltage, higher luminous efficiency, and longer lifetime. The electron injection layer 16 can be directly formed on the cathode 14. Namely, the low work function metal layer 16a, and the metal composite layer having carrier injection characteristics 16b can be subsequently formed directly on the cathode 14. The low work function metal layer 16a of the disclosure means a metal layer being apt to lose electrons and having a work function of less than or equal to 4.0 eV.

For example, materials of the low work function metal layer 16a can be Li, Na, K, Cu, Mg, Ca or alloys thereof. If the organic light-emitting diode 11 is a bottom-emission organic light-emitting diode, the low work function metal layer 16a would have a thickness of 1-50 Å. If the organic light-emitting diode 11 is a top-emission organic light-emitting diode, the low work function metal layer 16a would have a thickness of 1-500 Å. The metal composite layer having carrier injection characteristics 16b can have a thickness of 1-50 Å. Moreover, the metal composite layer having carrier injection characteristics can be a metal oxide having carrier injection characteristics, metal halide having carrier injection characteristics or combinations thereof, such as molybdenum oxide ($MoO_3$), tungsten oxide ($WO_3$), rhenium oxide ($ReO_3$, or $Re_2O_7$), copper iodide (CuI), copper fluoride ($CuF_2$), iron oxide ($Fe_3O_4$), iron chloride ($FeCl_3$), vanadium oxide ($V_2O_5$) or combinations thereof.

The light-emitting layer 20 can be an organic semiconductor material (such as organic small molecule material, or polymer material) or organic-metallic materials, and can be formed by thermal vacuum evaporation, physical vapor deposition, chemical vapor deposition (organic small molecule material), spin coating, ink-jet printing, or screen printing (polymer material) methods. The thickness of the light-emitting layer 20 is not limited and can be optionally modified by a person of ordinary skill in the field. The light-emitting layer 20 can include a light-emitting material and further includes an electroluminescent dopant doped into the light-emitting material. The dose of the dopant is not limited and can be optionally modified by a person of ordinary skill in the field.

The dopant can perform energy transfer or carrier trapping under electron-hole recombination in the light-emitting layer. The light-emitting material can be fluorescent or phosphorescent materials.

It should be noted that the light-emitting layer 20 can comprise a single electroluminescent unit, resulting in an organic light-emitting diode 11 with a red, blue, yellow, or green emission. Further, the electroluminescent layer can comprise a plurality of electroluminescent units, such that a tandem organic light-emitting diode 11 with white emission can be achieved by mixing different colors.

If the organic light-emitting diode 11 is a bottom-emission organic light-emitting diode, the anode would be an opaque electrode. The opaque electrode can be a metal electrode with relatively high thickness (such as Al, Cu, Mo, Ti, Pt, Ir, Ni, Cr, Ag, Au, W, or alloys thereof), or a transparent electrode (such as indium tin oxide (ITO), indium zinc oxide (IZO), aluminum zinc oxide (AZO), or zinc oxide (ZnO)) having a reflective layer thereon Further, if the organic light-emitting diode 11 is a top-emission organic light-emitting diode, the anode would be a transparent electrode or semi-transparent electrode. Materials of the transparent electrode can be indium tin oxide (ITO), indium zinc oxide (IZO), aluminum zinc oxide (AZO), or zinc oxide (ZnO). The semi-transparent electrode can have a transparency of more than 50% and be a semi-transparent metal layer electrode (such as Al, Cu, Mo, Ti, Pt, Ir, Ni, Cr, Ag, Au, W, or alloys thereof) or a composite electrode including metal and transparent conductive material (such as indium tin oxide (ITO), indium zinc oxide (IZO), aluminum zinc oxide (AZO), or zinc oxide (ZnO). Further, if the organic light-emitting diode 11 is a top-emission organic light-emitting diode, the cathode would be an opaque electrode. The opaque electrode can be a metal electrode with relatively high thickness (such as Al, Cu, Mo, Ti, Pt, Ir, Ni, Cr, Ag, Au, W, or alloys thereof), or a transparent electrode (such as indium tin oxide (ITO), indium zinc oxide (IZO), aluminum zinc oxide (AZO), or zinc oxide (ZnO)) having a reflective layer thereon.

Figure 2:
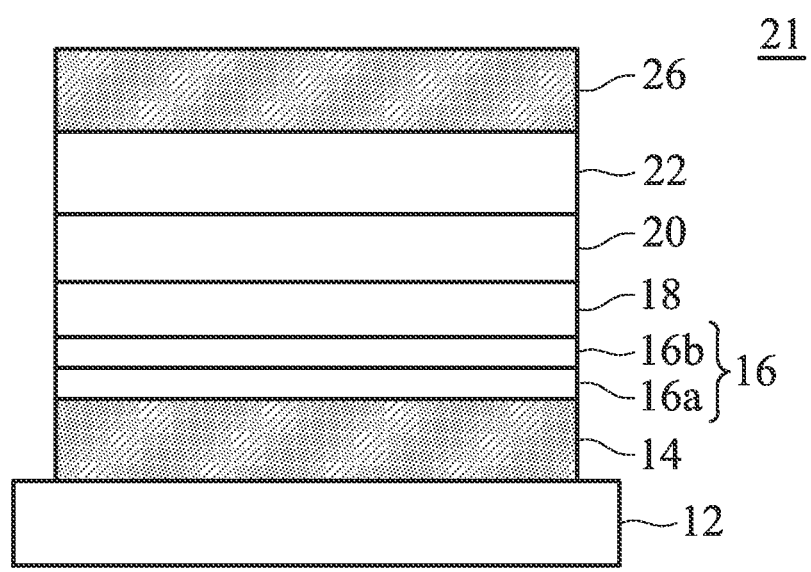
FIG. 2 is a cross-section of an organic light-emitting diode according to another embodiment of the invention.
Figure 3:
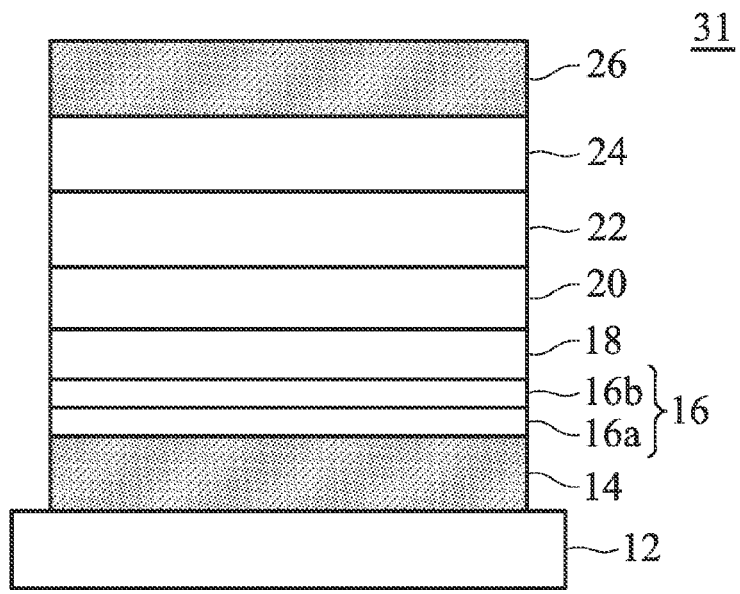
FIG. 3 is a cross-section of an organic light-emitting diode according to still another embodiment of the invention.

As shown in FIG. 2, an organic light-emitting diode 21 according to another embodiment of the disclosure is provided. Particularly, the organic light-emitting diode 21 can further include an electron transport layer 18 formed between the electron injection layer 16 and the light-emitting layer 20, and a hole transport layer 22 formed between the light-emitting layer 20 and the anode 26. As shown in FIG. 3, an organic light-emitting diode 31 according to yet another embodiment of the disclosure is provided. The organic light-emitting diode 31 can further have a hole injection layer 24 formed between the hole transport layer 22 and the anode 26. In the organic light-emitting diode 31, the minimum distance between the substrate 12 and the electron injection layer 16 is less than the minimum distance between the substrate 12 and the hole injection layer 24.

Materials of the electron transport layer 18, the hole transport layer 22, and the hole injection layer 24 of the disclosure can be an organic semiconductor material (such as organic small molecule material, or polymer material) or organic-metallic materials, and can be formed by thermal vacuum evaporation, physical vapor deposition, chemical vapor deposition (organic small molecule material), spin coating, ink-jet printing, or screen printing (polymer material) methods. Further, the thickness of the electron transport layer 18, the hole transport layer 22, or the hole injection layer 24 is not limited and can be optionally modified by a person of ordinary skill in the field.

Figure 4:
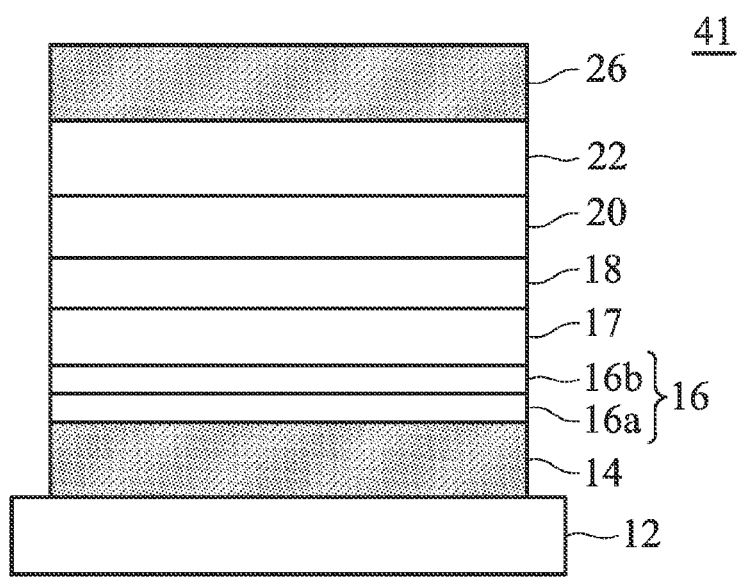
FIG. 4 is a cross-section of an organic light-emitting diode according to other embodiments of the invention.

According to another embodiment of the invention, as shown in FIG. 4, the organic light-emitting diode 41 can further include an n-doped electron transport layer 17, disposed between the electron injection layer 16 and the electron transport layer 18, thereby improving electron transport characteristics, reducing the driving voltage, and increasing luminous efficiency and lifetime of the organic light-emitting diode. The n-doped electron transport layer 17 is formed by doping an electron transport material with a dopant, wherein the electron transport material can be any conventional electron transport material, and the dopant can be alkali metal, alkali metal nitride, alkali metal acetate, alkali metal carbonate, or alkali metal nitrate. According to some embodiments of the invention, the dopant can be lithium, lithium nitride, lithium acetate, lithium carbonate, lithium nitrate, cesium, cesium nitride, cesium acetate, cesium carbonate, or cesium nitrate. If the dopant is alkali metal, the dopant would have a weight percentage of 1-20 wt %, based on the weight of the n-doped electron transport layer 17. If the dopant is alkali metal nitride, alkali metal acetate, alkali metal carbonate, or alkali metal nitrate, the dopant would have a weight percentage of 1-50 wt %, based on the weight of the n-doped electron transport layer 17. An overly low weight percentage of the dopant may reduce the electron transport characteristic of the n-doped electron transport layer 17. On the other hand, an overly high weight percentage of the dopant may reduce the lifetime of the organic light-emitting diode. Moreover, the n-doped electron transport layer 17 has a thickness of 200-1000 Å.

Figure 5:
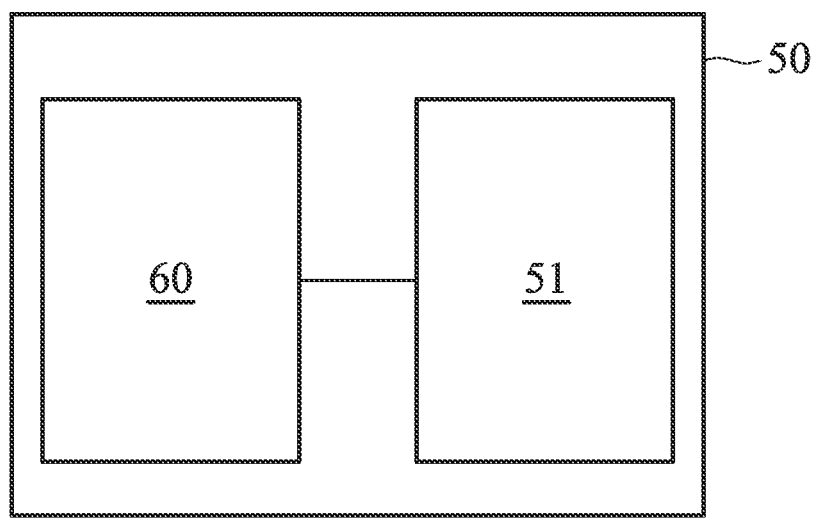
FIG. 5 schematically shows a block diagram of a display device according to an embodiment of the invention.

The disclosure also provides a display device 100 including the organic light-emitting diode 51, as shown in FIG. 5. The display device 100 can be an electrical device such as notebook computer, mobile phone, digital camera, personal data assistant (PDA), desktop computer, television, car display, or portable DVD player. The display device 100 of the disclosure can include a plurality of pixels 50, wherein each pixel 50 includes an organic light-emitting diode 51 and a transistor 60, wherein the transistor 60 is coupled to the organic light-emitting diode 51. The organic light-emitting diode 51 can be the organic light-emitting diode 11, 21, 31, or 41 of the above embodiments. The transistor 60 can be a thin film transistor, such as a poly-silicon thin film transistor, an amorphous silicon (a-Si) thin film transistor, an organic-semiconductor thin film transistor, or a semiconductor oxide (such as indium gallium zinc oxide (IGZO) or indium-zinc oxide (IZO)) thin film transistor. Moreover, the thin film transistor can be an n-type transistor or a p-type transistor.

According to an embodiment of the invention, the transistor 60 can be an n-type transistor. In order to prevent image sticking, the drain electrode of the n-type transistor can be coupled to the cathode of the organic light-emitting diode of the disclosure (i.e. an inverted organic light-emitting diode (including a cathode, an electron injection layer, an electron transport layer, a light-emitting layer, a hole transport layer, a hole injection layer, and an anode formed sequentially on the substrate). Therefore, the display device can exhibit high luminous efficiency and low driving voltage due to the superior electron injection characteristics of the organic light-emitting diode.

The following examples are intended to illustrate the disclosure more fully without limiting their scope, since numerous modifications and variations will be apparent to those skilled in this art.

Example 1

Organic Light-Emitting Diode (I)

A glass substrate with an indium tin oxide (ITO) film (serving as a cathode) of 700 Å was provided and then washed with a cleaning agent, acetone, and ethanol with ultrasonic agitation. After drying, the ITO film was subjected to a uv/ozone treatment. Next, a low work function metal layer, a metal composite layer having carrier injection characteristic, an electron transport layer, a red light-emitting layer, a hole transport layer, a hole injection layer, and a metal anode were subsequently formed on the ITO film at $1 \times 10^{-5}$ Pa, obtaining the organic light-emitting diode (I). The materials and layers formed therefrom are described in the following.

The low work function metal layer, with a thickness of 30 Å, consisted of Mg. The metal composite layer having carrier injection characteristics, with a thickness of 10 Å, consisted of $MoO_3$. The n-doped electron transport layer, with a thickness of 200 Å, consisted of BPhen (4,7-diphenyl-1,10-phenanthroline) as a host and Li as a dopant, wherein the weight ratio between BPhen and Li was 1:0.08. The electron transport layer, with a thickness of 100 Å, consisted of BPhen (4,7-diphenyl-1,10-phenanthroline). The red light-emitting layer, with a thickness of 400 Å, consisted of Rubrence and Alq3 (Tris(8-hydroxy-quinolinato)aluminum) as hosts (the weight ratio between Rubrence and Alq3 was 1:1), and DCJTB (4-(dicyanomethylene)-2-tert-butyl-6-(1,1,7,7-tetramethyljulolidin-4-yl-vinyl)-4H-pyran) as a dopant, wherein the weight ratio between the hosts and dopant was 1:0.01. The hole transport layer, with a thickness of 300 Å, consisted of NPB (N,N'-bis(naphthalen-1-yl)-N,N'-bis(phenyl)-benzidine). The hole injection layer, with a thickness of 50 Å, consisted of HAT-CN (Dipyrazino[2,3-f:2',3'-h]quinoxaline-2,3,6,7,10,11-hexacarbonitrile). The metal anode, with a thickness of 1500 Å, consisted of Al.

The structure of the organic light-emitting diode (I) can be represented as below: ITO 700 Å/Mg 30 Å/$MoO_3$ 10 Å/BPhen:Li (1:0.08) 200 Å/BPhen 100 Å/Rubrence & $Alq_3$ (1:1):DCJTB (1:0.01) 400 Å/NPB 300 Å/HAT-CN 50 Å/Al 1500 Å.

The optical properties of the organic light-emitting diode (I), as described in Example 1, were measured by a PR650 (purchased from Photo Research Inc.) and a Minolta TS110.

Comparative Example 1

Organic Light-Emitting Diode (II)

Comparative Example 1 was performed in the same manner as in Example 1 except for removal of the low work function metal layer of Example 1. The structure of the organic light-emitting diode (II) can be represented as below: ITO 700 Å/MoO$_3$ 10 Å/BPhen:Li (1:0.08) 200 Å/BPhen 100 Å/Rubrence & Alq$_3$(1:1):DCJTB (1:0.01) 400 Å/NPB 300 Å/HAT-CN 50 Å/Al 1500 Å.

The optical properties of the organic light-emitting diode (II), as described in Comparative Example 1, were measured by a PR650 (purchased from Photo Research Inc.) and a Minolta TS110.

Table 1 shows the relative optical properties of the organic light-emitting diodes (I) and (II) under the same operating conditions (operating at a current density of 10 mA/cm$^2$).

TABLE 1

|  | Relative driving voltage (%) | Relative brightness (%) | Relative current efficiency (%) | Relative power efficiency (%) |
| --- | --- | --- | --- | --- |
| Organic light-emitting diode (I) | 90.7% | 148.5% | 148.5% | 163.8% |
| Organic light-emitting diode (II) | 100% | 100% | 100% | 100% |

As shown in Table 1, since the organic light-emitting diode (I) has a low work function metal layer formed between the cathode and the metal composite layer, the driving voltage of the organic light-emitting diode (I) is reduced about 10% and the current efficiency of the organic light-emitting diode (I) is increased by about 40%, in comparison with the organic light-emitting diode (II).

Comparative Example 2

Organic Light-Emitting Diode (III)

Comparative Example 2 was performed in the same manner as in Example 1 except for removal of the metal composite layer having carrier injection characteristics of Example 1. The structure of the organic light-emitting diode (III) can be represented as below: ITO 700 Å/Mg 30 Å/BPhen:Li (1:0.08) 200 Å/BPhen 100 Å/Rubrence & Alq$_3$(1:1):DCJTB (1:0.01) 400 Å/NPB 300 Å/HAT-CN 50 Å/Al 1500 Å. The optical properties of the organic light-emitting diode (III), as described in Comparative Example 2, were measured by a PR650 (purchased from Photo Research Inc.) and a Minolta TS110.

Table 2 shows the relative optical properties of the organic light-emitting diodes (I) and (III) under the same operating conditions (operating at a current density of 10 mA/cm$^2$).

TABLE 2

|  | Relative driving voltage (%) | Relative brightness (%) | Relative current efficiency (%) | Relative power efficiency (%) |
| --- | --- | --- | --- | --- |
| Organic light-emitting diode (I) | 97.2% | 125.4% | 125.4% | 129.1% |
| Organic light-emitting diode (III) | 100% | 100% | 100% | 100% |

As shown in Table 2, since the organic light-emitting diode (I) has a metal composite layer having carrier injection characteristics, the driving voltage of the organic light-emitting diode (I) is reduced about 3% and the current efficiency of the organic light-emitting diode (I) is increased about 25%, in comparison with the organic light-emitting diode (III).

Example 2

Organic Light-Emitting Diode (IV)

A glass substrate with an indium tin oxide (ITO) film (serving as a cathode) of 700 Å was provided and then washed with a cleaning agent, acetone, and ethanol with ultrasonic agitation. After drying, the ITO film was subjected to a uv/ozone treatment. Next, a low work function metal layer, a metal composite layer having carrier injection characteristic, an n-doped electron transport layer, an electron transport layer, a green light-emitting layer, a hole transport layer, a hole injection layer, and a metal anode were subsequently formed on the ITO film at $1\times10^{-5}$ Pa, obtaining the organic light-emitting diode (IV). The materials and layers formed therefrom are described in the following.

The low work function metal layer, with a thickness of 30 Å, consisted of Mg. The metal composite layer having carrier injection characteristics, with a thickness of 10 Å, consisted of MoO$_3$. The n-doped electron transport layer, with a thickness of 200 Å, consisted of BPhen (4,7-diphenyl-1,10-phenanthroline) as a host and Li as a dopant, wherein the weight ratio between BPhen and Li was 1:0.08. The electron transport layer, with a thickness of 100 Å, consisted of BPhen (4,7-diphenyl-1,10-phenanthroline). The green light-emitting layer, with a thickness of 400 Å, consisted of TPBA (2,2'-bi(9,10-diphenyl-anthracene) as a host, and C545T(10-(2-Benzothiazolyl)-2,3,6,7-tetrahydro-1,1,7,7-tetramethyl-1H,5H,11H-(1)benzopyropyrano(6,7-8-Ij)quinolizin-11-one) as a dopant, wherein the weight ratio between the hosts and dopant was 1:0.05. The hole transport layer, with a thickness of 300 Å, consisted of NPB (N,N'-bis(naphthalen-1-yl)-N,N'-bis(phenyl)-benzidine). The hole injection layer, with a thickness of 50 Å, consisted of HAT-CN (Dipyrazino[2,3-f:2',3'-h]quinoxaline-2,3,6,7,10,11-hexacarbonitrile). The metal anode, with a thickness of 1500 Å, consisted of Al.

The structure of the organic light-emitting diode (IV) can be represented as below: ITO 700 Å/Mg 30 Å/MoO$_3$ 10 Å/BPhen:Li (1:0.08) 200 Å/BPhen 100 Å/TPBA:C545T (1:0.05) 400 Å/NPB 300 Å/HAT-CN 50 Å/Al 1500 Å.

The optical properties of the organic light-emitting diode (IV), as described in Example 2, were measured by a PR650 (purchased from Photo Research Inc.) and a Minolta TS110.

Comparative Example 3

Organic Light-Emitting Diode (V)

A glass substrate with an indium tin oxide (ITO) film (serving as an anode) of 700 Å was provided and then washed with a cleaning agent, acetone, and ethanol with ultrasonic agitation. After drying, the ITO film was subjected to a uv/ozone treatment. Next, a hole injection layer, a hole transport layer, an green light-emitting layer, electron transport layer, electron injection layer, and a metal cathode were subsequently formed on the ITO film at $1\times10^{-5}$ Pa, obtaining the organic light-emitting diode (V). The materials and layers formed therefrom are described in the following.

The hole injection layer, with a thickness of 50 Å, consisted of HAT-CN (Dipyrazino[2,3-f:2',3'-h]quinoxaline-2,3,6,7, 10,11-hexacarbonitrile). The metal anode, with a thickness of 1500 Å, consisted of Al. The hole transport layer, with a thickness of 300 Å, consisted of NPB (N,N'-bis(naphthalen-1-yl)-N,N'-bis(phenyl)-benzidine). The electron transport layer, with a thickness of 100 Å, consisted of BPhen (4,7-diphenyl-1,10-phenanthroline). The green light-emitting layer, with a thickness of 400 Å, consisted of TPBA (2,2'-bi(9,10-diphenyl-anthracene) as a host, and C545T(10-(2-Benzothiazolyl)-2,3,6,7-tetrahydro-1,1,7,7-tetramethyl-1H,5H,11H-(1)benzopyropyrano(6,7-8-Ij)quinolizin-11-one) as a dopant, wherein the weight ratio between the host and dopant was 1:0.05. The electron transport layer, with a thickness of 100 Å, consisted of BPhen (4,7-diphenyl-1,10-phenanthroline). The electron injection layer, with a thickness of 10 Å, consisted of LiF. The cathode, with a thickness of 1500 Å, consisted of Al.

The structure of the organic light-emitting diode (V) can be represented as below: ITO 700 Å/HAT-CN 50 Å/NPB 300 Å/TPBA:C545T (1:0.05) 400 Å/BPhen 300 Å/LiF 10 Å/Al 1500 Å.

The optical properties of the organic light-emitting diode (V), as described in Comparative Example 3, were measured by a PR650 (purchased from Photo Research Inc.) and a Minolta TS110.

Figure 6:
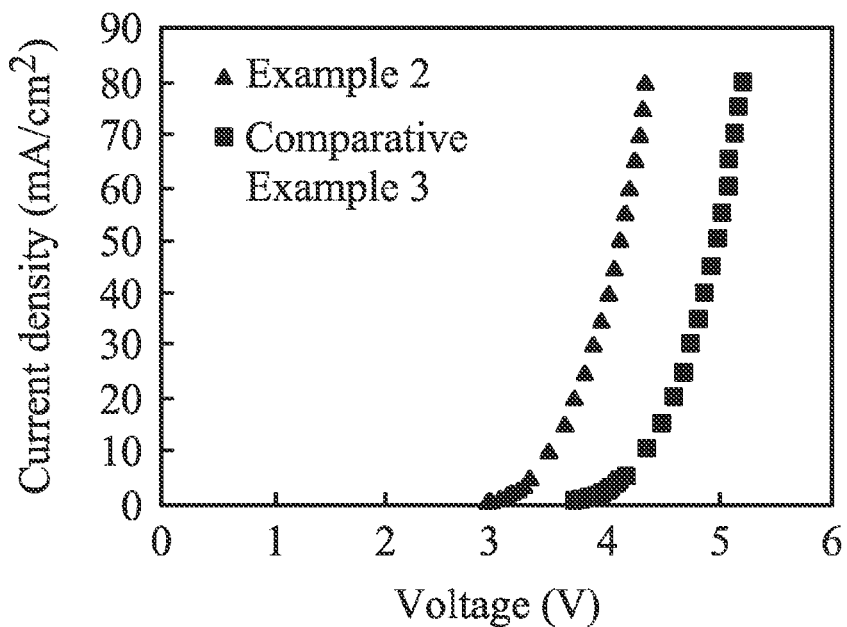
FIG. 6 shows a graph plotting operating voltage against current density of the organic light-emitting diodes (IV) and (V)
Figure 7:
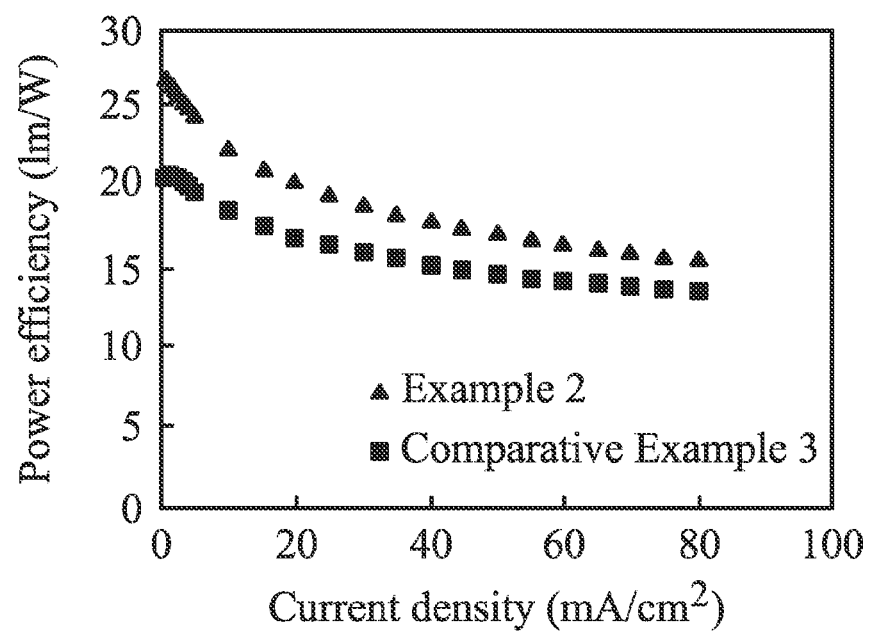
FIG. 7 shows a graph plotting current density against power efficiency of the organic light-emitting diodes (IV) and (V)
Figure 8:
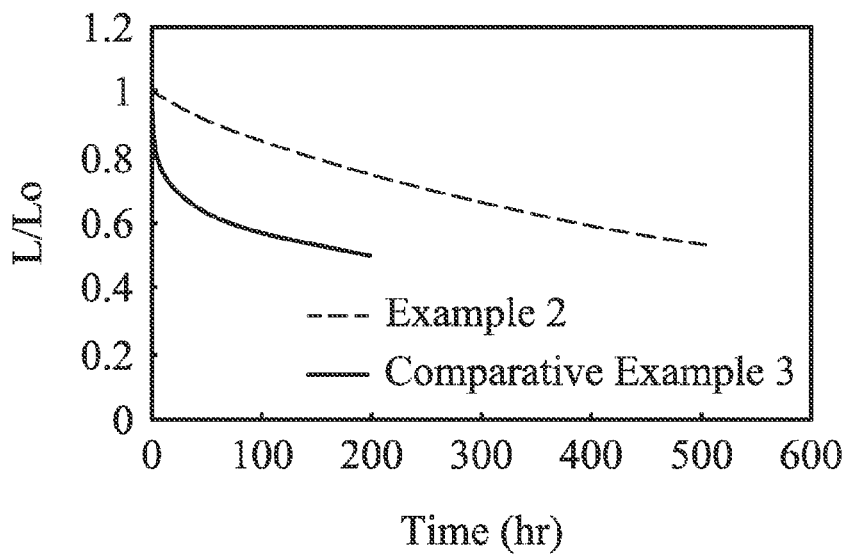
FIG. 8 shows a graph plotting L/Lo (brightness/initial brightness) against time of the organic light-emitting diodes (IV) and (V)

FIG. 6 shows a graph plotting operating voltage against current density of the organic light-emitting diodes (IV) and (V). FIG. 7 shows a graph plotting current density against power efficiency of the organic light-emitting diodes (IV) and (V). FIG. 8 shows a graph plotting L/Lo (brightness/initial brightness) against time of the organic light-emitting diodes (IV) and (V). Table 3 shows the relative optical properties of the organic light-emitting diodes (IV) and (V) under the same operating conditions (operating at a current density of 10 mA/cm$^2$).

TABLE 3

| | Relative driving voltage (%) | Relative brightness (%) | Relative current efficiency (%) | Relative lifetime (%) (under 60 mA/cm$^2$) |
|---|---|---|---|---|
| Organic light-emitting diode (IV) | 79% | 97% | 122% | 280% |
| Organic light-emitting diode (V) | 100% | 100% | 100% | 100% |

As shown in FIGS. 6-8 and Table 3, since the organic light-emitting diode (IV) has a the structure (low work function metal layer/metal composite layer having carrier injection characteristics/n-doped electron transport layer), the driving voltage of the inverted organic light-emitting diode (IV) is reduced about 20% and the current efficiency of the organic light-emitting diode (IV) is increased about 20%, in comparison with the standard organic light-emitting diode (V). Further, the lifetime of the inverted organic light-emitting diode (IV) is 2.8 times longer than that of the organic light-emitting diode (V).

Example 3

Organic Light-Emitting Diode (VI)

A glass substrate was provided and then washed with a cleaning agent, acetone, and ethanol with ultrasonic agitation. After drying, a reflective layer, a cathode, a low work function metal layer, a metal composite layer having carrier injection characteristic, an n-doped electron transport layer, an electron transport layer, a blue light-emitting layer, a hole transport layer, a hole injection layer, and a transparent anode were subsequently formed on the substrate at 1×10$^{-5}$ Pa, obtaining the organic light-emitting diode (VI). The materials and layers formed therefrom are described in the following.

The reflective layer, with a thickness of 1000 Å, consisted of Al. The cathode, with a thickness of 100 Å, consisted of ITO. The low work function metal layer, with a thickness of 30 Å, consisted of Mg. The metal composite layer having carrier injection characteristic, with a thickness of 10 Å, consisted of MoO$_3$. The n-doped electron transport layer, with a thickness of 200 Å, consisted of BPhen (4,7-diphenyl-1,10-phenanthroline) as a host and Li as a dopant, wherein the weight ratio between BPhen and Li was 1:0.08. The electron transport layer, with a thickness of 100 Å, consisted of BPhen (4,7-diphenyl-1,10-phenanthroline). The blue light-emitting layer, with a thickness of 250 Å, consisted of MADN (2-methyl-9,10-bis(naphthalen-2-yl)anthracene) as a host, and DPVABi(4,4'-bis[4-(di-p-tolylamino)styryl]biphenyl) as a dopant, wherein the weight ratio between the MADN and DPVABi was 1:0.05. The hole transport layer, with a thickness of 250 Å, consisted of NPB (N,N'-bis(naphthalen-1-yl)-N,N'-bis(phenyl)-benzidine). The transparent anode, with a thickness of 800 Å, consisted of IZO.

The structure of the organic light-emitting diode (VI) can be represented as below: Al 1000 Å/ITO 100 Å/Mg 30 Å/MoO$_3$ 10 Å/BPhen:Li (1:0.08) 150 Å/BPhen 100 Å/MADN:DPVABi (1:0.05) 250 Å/NPB 250 Å/HAT-CN 50 Å/IZO 800 Å.

The optical properties of the organic light-emitting diode (VI), as described in Example 3, were measured by a PR650 (purchased from Photo Research Inc.) and a Minolta TS110.

Comparative Example 4

Organic Light-Emitting Diode (VII)

A glass substrate was provided and then washed with a cleaning agent, acetone, and ethanol with ultrasonic agitation. After drying, a reflective layer, an anode, a hole injection layer, a hole transport layer, a blue light-emitting layer, an electron transport layer, an electron injection layer, and a transparent cathode were subsequently formed on the substrate at 1×10$^{-5}$ Pa, obtaining the organic light-emitting diode (VII). The materials and layers formed therefrom are described in the following.

The reflective layer, with a thickness of 1000 Å, consisted of Al. The anode, with a thickness of 100 Å, consisted of ITO. The hole injection layer, with a thickness of 50 Å, consisted of HAT-CN (Dipyrazino[2,3-f:2',3'-h]quinoxaline-2,3,6,7,10,11-hexacarbonitrile). The hole transport layer, with a thickness of 250 Å, consisted of NPB (N,N'-bis(naphthalen-1-yl)-N,N'-bis(phenyl)-benzidine). The blue light-emitting layer, with a thickness of 250 Å, consisted of MADN (2-methyl-9,10-bis(naphthalen-2-yl)anthracene) as a host, and DPVABi (4,4'-bis[4-(di-p-tolylamino)styryl]biphenyl) as a dopant, wherein the weight ratio between the MADN and DPVABi was 1:0.05. The electron transport layer, with a thickness of 100 Å, consisted of BPhen (4,7-diphenyl-1,10-phenanthroline). The electron injection layer, with a thickness of 150 Å, consisted of BPhen (4,7-diphenyl-1,10-phenanthroline) as a host and Li as a dopant, wherein the weight ratio between BPhen and Li was 1:0.08. The transparent cathode, with a thickness of 800 Å, consisted of IZO.

The structure of the organic light-emitting diode (VI) can be represented as below: Al 1000 Å/ITO 100 Å/HAT-CN 50 Å/NPB 250 Å/MADN:DPVABi (1:0.05) 250 Å/BPhen 100 Å/BPhen:Li (1:0.08) 150 Å/IZO 800 Å.

The optical properties of the organic light-emitting diode (VII), as described in Comparative Example 4, were measured by a PR650 (purchased from Photo Research Inc.) and a Minolta TS110.

Figure 9:
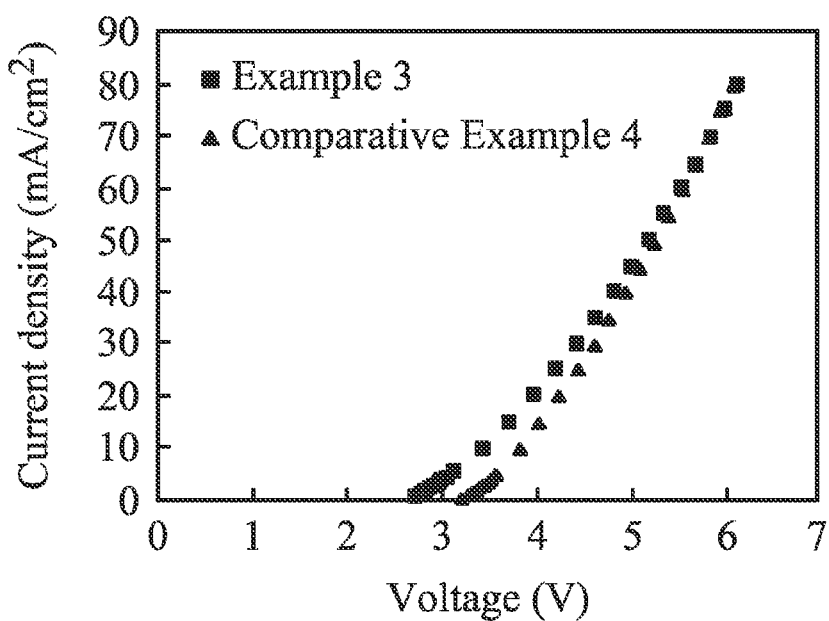
FIG. 9 shows a graph plotting operating voltage against current density of the organic light-emitting diodes (VI) and (VII)
Figure 10:
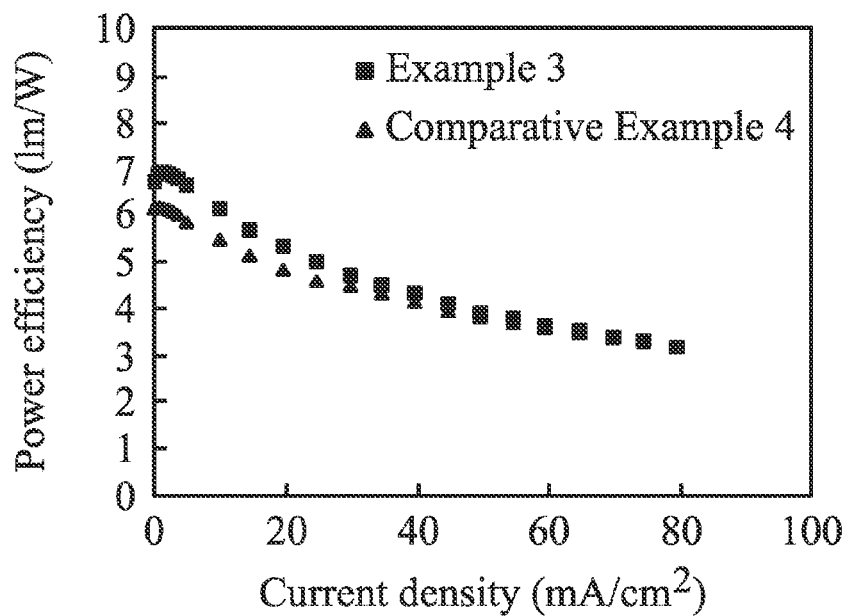
FIG. 10 shows a graph plotting current density against power efficiency of the organic light-emitting diodes (VI) and (VII)
Figure 11:
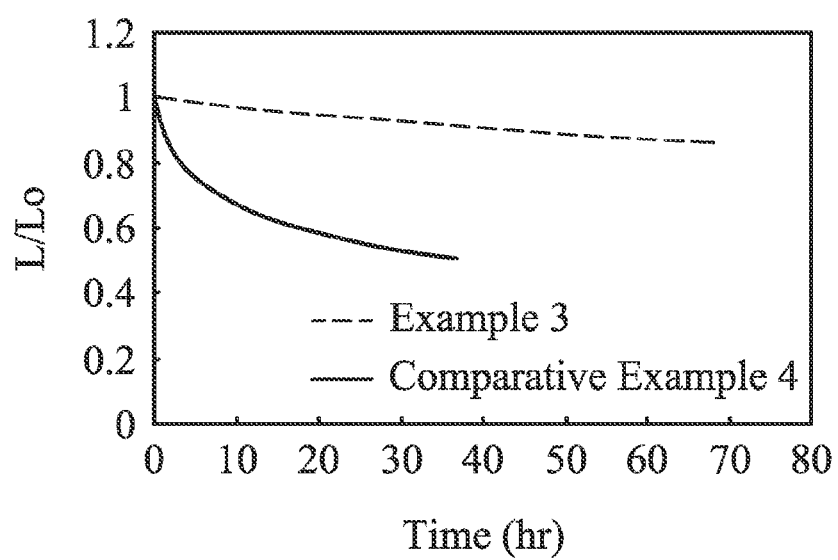
FIG. 11 shows a graph plotting L/Lo (brightness/initial brightness) against time of the organic light-emitting diodes (VI) and (VII).

FIG. 9 shows a graph plotting operating voltage against current density of the organic light-emitting diodes (VI) and (VII). FIG. 10 shows a graph plotting current density against power efficiency of the organic light-emitting diodes (VI) and (VII). FIG. 11 shows a graph plotting L/Lo (brightness/initial brightness) against time of the organic light-emitting diodes (VI) and (VII). Table 4 shows the relative optical properties of the organic light-emitting diodes (VI) and (VII) under the same operating conditions (operating at a current density of 10 mA/cm$^2$).

TABLE 4

| | Relative driving voltage (%) | Relative brightness (%) | Relative current efficiency (%) | Relative lifetime (%) (under 60 mA/cm$^2$) |
|---|---|---|---|---|
| organic light-emitting diode (VI) | 88% | 96% | 109% | 580% |
| organic light-emitting diode (VII) | 100% | 100% | 100% | 100% |

As shown in FIGS. 9-11 and Table 4, since the organic light-emitting diode (VI) has the structure (low work function metal layer/metal composite layer having carrier injection characteristics/n-doped electron transport layer), the driving voltage of the inverted organic light-emitting diode (VI) is reduced about 12% and the current efficiency of the organic light-emitting diode (VI) is increased about 9%, in comparison with the standard organic light-emitting diode (VII). Further, the lifetime of the inverted organic light-emitting diode (VI) is 5.8 times longer than that of the organic light-emitting diode (VII).

Example 4

Organic Light-Emitting Diode (VIII)

Example 4 was performed in the same manner as in Example 3 except for substitution of Li for Mg disclosed in the low work function metal layer, and substitution of ReO$_3$ for MoO$_3$ disclosed in the metal composite layer having carrier injection characteristic. The structure of the organic light-emitting diode (VIII) can be represented as: Al 1000 Å/ITO 100 Å/Li 30 Å/ReO$_3$ 10 Å/BPhen:Li (1:0.08) 150 Å/BPhen 100 Å/MADN:DPVABi (1:0.05) 250 Å/NPB 250 Å/HAT-CN 50 Å/IZO 800 Å.

Example 5

Organic Light-Emitting Diode (IX)

Example 5 was performed in the same manner as in Example 3 except for substitution of Ca for Mg disclosed in the low work function metal layer, and substitution of V$_2$O$_5$ for MoO$_3$ disclosed in the metal composite layer having carrier injection characteristic. The structure of the organic light-emitting diode (IX) can be represented as: Al 1000 Å/ITO 100 Å/Ca 30 Å/V$_2$O$_5$ 10 Å/BPhen:Li (1:0.08) 150 Å/BPhen 100 Å/MADN:DPVABi (1:0.05) 250 Å/NPB 250 Å/HAT-CN 50 Å/IZO 800 Å.

Accordingly, the disclosure discloses an organic light-emitting diode (such as an inverted organic light-emitting diode) having a composite electron injection layer (including a low work function metal layer and a metal composite layer having carrier injection characteristics). Due to the composite electron injection layer, the organic light-emitting diode exhibits an improved electron injection characteristic, thereby reducing the driving voltage, and increasing the luminous efficiency and lifetime of the organic light-emitting diode.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic light-emitting diode, comprising:
   a substrate;
   a cathode disposed on the substrate;
   an electron injection layer directly disposed on the cathode, wherein the electron injection layer comprises a low work function metal layer, and a metal composite layer having a carrier injection characteristic, wherein the metal composite layer having carrier injection characteristics has a thickness of 1-50 Å;
   a light-emitting layer disposed on the electron injection layer;
   an n-doped electron transport layer disposed between the electron injection layer and the light-emitting layer, wherein the n-doped electron transport layer is made by doping an electron transport material with a dopant, and wherein the dopant is alkali metal nitride, alkali metal acetate, alkali metal carbonate, or alkali metal nitrate, and the dopant has a weight percentage of 1-50 wt %, based on the weight of the n-doped electron transport layer; and
   an anode disposed on the light-emitting layer.

2. The organic light-emitting diode as claimed in claim 1, wherein the low work function metal layer has a work function of less than or equal to 4.0 eV.

3. The organic light-emitting diode as claimed in claim 1, wherein the low work function metal layer comprises Li, Na. K, Cu, Mg, Ca, or alloys thereof.

4. The organic light-emitting diode as claimed in claim 1, wherein the metal composite layer having carrier injection characteristics is a metal oxide having carrier injection characteristic, metal halide having carrier injection characteristics, or combinations thereof.

5. The organic light-emitting diode as claimed in claim 1, wherein the metal composite layer having carrier injection characteristics comprises molybdenum oxide, tungsten oxide, rhenium oxide, copper iodide, copper fluoride, iron oxide, iron chloride, vanadium oxide, or combinations thereof.

6. The organic light-emitting diode as claimed in claim 1, wherein the dopant is lithium nitride, lithium acetate, lithium carbonate, or lithium nitrate.

7. The organic light-emitting diode as claimed in claim 1, wherein the dopant is cesium nitride, cesium acetate, cesium carbonate, or cesium nitrate.

8. The organic light-emitting diode as claimed in claim 1, wherein the organic light-emitting diode is a bottom-emission organic light-emitting diode, and the cathode is a transparent or semi-transparent electrode.

9. The organic light-emitting diode as claimed in claim 8, wherein the low work function metal layer has a thickness of 1-50 Å.

10. The organic light-emitting diode as claimed in claim 1, wherein the organic light-emitting diode is top-emission organic light-emitting diode, and the anode is a transparent or semi-transparent electrode.

11. The organic light-emitting diode as claimed in claim 10, wherein the low work function metal layer has a thickness of 1-500 Å.

12. The organic light-emitting diode as claimed in claim 1, further comprising:
   an electron transport layer disposed between the electron injection layer and the light-emitting layer; and
   a hole transport layer disposed between the light-emitting layer and the anode.

13. A display device, comprising:
   a plurality of pixels, wherein each pixel comprises:
   the organic light-emitting diode as claimed in claim 1; and
   a transistor coupled to the organic light-emitting diode.

14. The display device as claimed in claim 13, wherein the transistor is an n-type transistor, and a drain electrode of the transistor is electrically connected to the cathode of the organic light-emitting diode.

15. An organic light-emitting diode, comprising:
   a substrate;
   a cathode disposed on the substrate;
   an electron injection layer directly disposed on the cathode, wherein the electron injection layer comprises a low work function metal layer, and a metal composite layer having a carrier injection characteristic;
   a light-emitting layer disposed on the electron injection layer;
   an n-doped electron transport layer disposed between the electron injection layer and the light-emitting layer, wherein the n-doped electron transport layer is made by doping an electron transport material with a dopant, and wherein the dopant is alkali metal nitride, alkali metal acetate, alkali metal carbonate, or alkali metal nitrate, and the dopant has a weight percentage of 1-50wt %, based on the weight of the n-doped electron transport layer; and
   an anode disposed on the light-emitting layer.

* * * * *